(12) United States Patent
Kraft

(10) Patent No.: US 7,550,966 B2
(45) Date of Patent: Jun. 23, 2009

(54) RETROFIT POSITIONAL SENSOR PIN FOR ARTICULATED ARMS

(75) Inventor: Brett W. Kraft, Leawood, KS (US)

(73) Assignee: Kraft Telerobotics, Inc., Overland Pk, KS (US)

( * ) Notice: Subject to any disclaimer, the term of this patent is extended or adjusted under 35 U.S.C. 154(b) by 0 days.

(21) Appl. No.: 11/982,569

(22) Filed: Nov. 2, 2007

(65) Prior Publication Data

US 2008/0191689 A1    Aug. 14, 2008

Related U.S. Application Data

(60) Provisional application No. 60/900,654, filed on Feb. 9, 2007.

(51) Int. Cl.
*G01B 7/30* (2006.01)
*G01R 33/07* (2006.01)

(52) U.S. Cl. .............................. 324/207.25; 324/207.2; 324/251

(58) Field of Classification Search ......... 324/173–174, 324/207.2, 207.25, 251; 73/514.31, 514.39, 73/514.16; 338/32 R, 32 H; 123/612, 617
See application file for complete search history.

(56) References Cited

U.S. PATENT DOCUMENTS

| 7,197,974 | B2* | 4/2007 | Glasson | 92/5 R |
| 2005/0083045 | A1* | 4/2005 | Miyagawa | 324/207.25 |

\* cited by examiner

*Primary Examiner*—Bot LeDynh
(74) *Attorney, Agent, or Firm*—John C. McMahon

(57) ABSTRACT

A retrofit pivot pin for positioning at a pivot joint between a pair of articulated arms including a Hall effect element secured to a first arm and a magnet secured to said second arm.

7 Claims, 3 Drawing Sheets

RETROFIT POSITIONAL SENSOR PIN FOR ARTICULATED ARMS

CROSS REFERENCE TO RELATED APPLICATION

This application claims the benefit of U.S. Provisional Application No. 60/900,654 filed Feb. 9, 2007 and incorporated by reference herein.

BACKGROUND OF THE INVENTION

The present invention is directed to a replacement pivot pin for a joint of an articulated system having at least a pair of arms that swing or rotate relative to each other wherein a sensor utilizing the Hall effect provides information to a remote location as to the angular position of one arm relative to the other.

Articulated arms are utilized on many types of equipment including construction equipment such as backhoes, excavators, mechanical arms such as on undersea exploration vehicles and on space vehicles such as the space station. Most of such arms can be visualized by an operator who controls the arms from a master controller which may be very closely spaced relative to the arm or at a substantial distance in which case the arm may be viewed by video. When the user can see the position of the arms relative to each other and to their environment, the operator uses such visual information to control the relative position of the arms.

However, in certain circumstances the operator cannot visually see the arms or the arm is to be controlled by a computer. In such a situation it is necessary for the operator or computer to be able to determine the relative position of the arms by some other method. Furthermore, even if the arms can be seen, it is sometimes helpful or important for the information to be transmitted elsewhere for use in conjunction with computer programs, for data storage or the like.

As most articulated arm systems are not initially provided with some type of position sensor, it is also important that such a device be easily retrofitted to articulated systems. Some sensory devices also require substantial modification of the equipment or addition of parts such as shafts that extend outwardly and add complexity to the equipment and that may make the equipment subject to breakdown.

Some types of position sensing devices utilize contacts that are located about an articulating joint. However, contact sensors are not a very viable solution for equipment that must operate under conditions that can foul the contacts or wear on the contacts. Contact sensors may also not have the sensitivity required for many uses of such a device. Many types of position sensors can not function in severe or hazardous service.

It is also noted that some types of position sensors are placed in hydraulic cylinders that move the arms. Such sensors present problems because the leads must pass through a high pressure barrier and many hydraulic systems are converting from an oil to a water based system. While the oil does not cause conductivity problems, the water can short out such systems.

Therefore, a position sensor that does not require major modification is desirable for use in determining relative positions of arms in an articulated device wherein the positions can be transmitted to remote locations and wherein the sensor can withstand rugged conditions and is highly sensitive to small changes in position.

SUMMARY OF THE INVENTION

A positional sensor, especially for retrofit, into an articulated arm structure wherein one arm pivots about a pivot pin relative to a second arm. The sensor includes structure that replaces the original pivot axle or pin with minimal drilling or other structural modification to the arms or, alternatively, is provided as an original pivot pin. Such a sensor can be utilized at one or any number of the articulated joints of the system.

The sensor includes an elongate pin sized and shaped to be located between and in pivoting support of two arms that swing or rotate relative to one another and a bushing or bearing that is operably positioned between the pin and one arm and replaces the original bearing.

The bearing includes a pair of diagonally opposed magnet sets that have one or more high gauss magnets (preferably rare earth magnets such as neodymium magnets) that are operably positioned to be in close proximity to and rotate about the pin. The bearing is secured to a first of the arms. The bearing is generally non magnetic and constructed of bronze or the like.

The pin is secured to the second arm and is generally completely non magnetic and constructed of stainless steel with a chrome finish or the like. Located near one end of the pin and at least partially aligned with the magnets in the bearing is a bore within which is received a Hall effect element. The Hall effect element is aligned relative to the magnets such that rotation of the magnets in conjunction with angular movement of first arm relative to the second arm, produces a ratiometric change in an electrical output from the Hall effect element that is related to the relative rotation between the first and second arms. Each different output represents an absolute or specific angular configuration. The output is directed to a remote user of the output that converts the output to positional data for storage or use and/or provides a comparative visual display on a monitor or the like of the angular position of the first arm relative to the second arm.

As used herein the term Hall effect refers to a potential difference on opposite sides of a thin sheet or plate of conducting or semiconducting material (here the element) through which an electric current is flowing and created by a magnetic field applied perpendicular to the Hall element.

OBJECTS AND ADVANTAGES OF THE INVENTION

Therefore, the objects of the present invention are: to provide a position sensor for sensing the angular position of one arm pivoting relative to a second arm; to provide such a sensor that can be retrofitted to devices with articulating arms; to provide such a sensor that can withstand use in hazardous or stressful conditions, while remaining accurate; to provide such a sensor that can easily be mounted on existing equipment with little or no modification to the equipment other than that the pivot pin and bushing that are replaced; to provide such a sensor that provides a remote output with respect to the relative position between two arms that can be utilized in a closed loop servo control system for robotic master/slave operation of the arms or to drive a visual display for an operator to use; and to provide such a sensor that is easy to use, comparatively inexpensive to produce and especially well adapted for the intended usage thereof.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
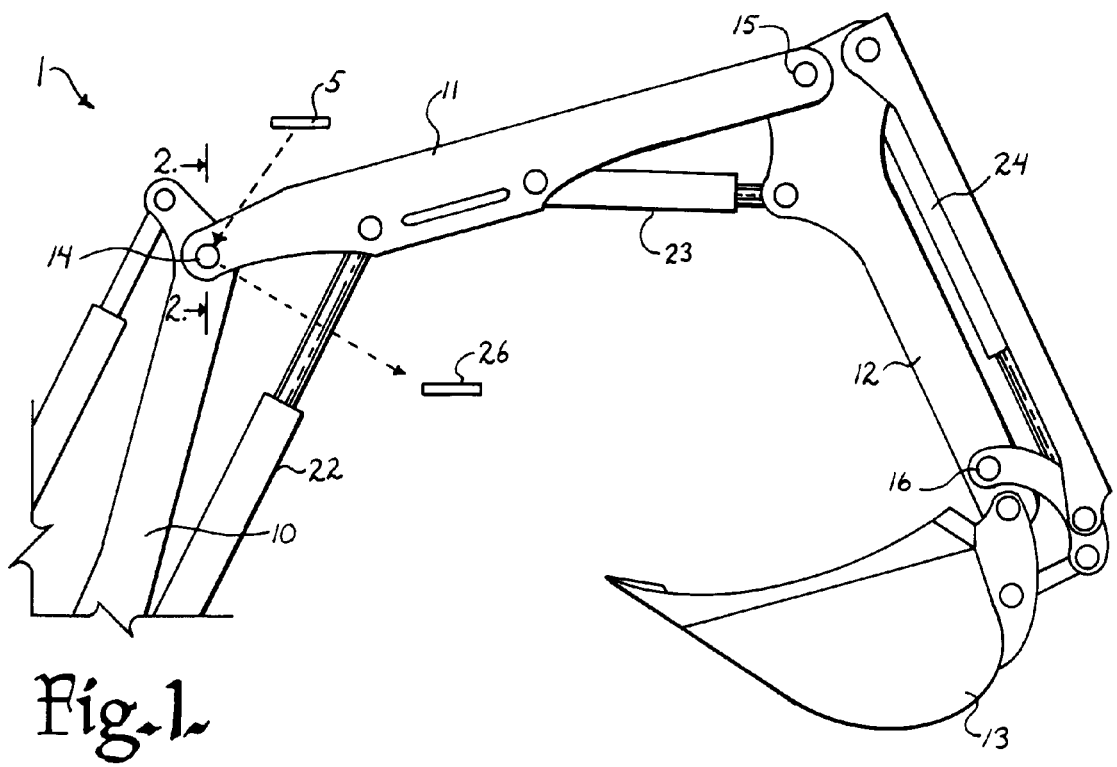
FIG. 1 is a fragmentary side elevational view of a backhoe apparatus having three articulating arms and a bucket with a sensor and original pivot pin shown exploded from the arm.

FIG. 1 shows an articulatable portion of a backhoe 1 with a sensor in accordance with the invention and generally identified by the reference numeral 5 shown prior to insertion in the backhoe 1.

The articulatable portion of the backhoe 1 has three arms 10, 11 and 12 and a scoop or bucket 13. The arms 10 and 11 are joined at a pivot joint 14. The arms 11 and 12 are joined at a pivot joint 15 and the bucket 13 is joined to the arm 12 at a pivot joint 16. Each of the pivot joints 14, 15 and 16 initially include a pivot pin 26 shown being removed in FIG. 1. The angular position of the arm 10 relative to the arm 11 is controlled by a hydraulic cylinder 22. The angular position of the arm 11 relative to the arm 12 is controlled by a hydraulic cylinder 23. And the angular position of the bucket 13 relative to the arm 12 is controlled by a hydraulic cylinder 24.

In accordance with the invention, it is foreseen that many types of articulated devices may utilize the sensor 5 whether initially fitted with the sensor 5 or retrofitted with the sensor 5. It is also foreseen that the sensor 5 may be used with any number of articulated arms on a device and with many different types of tools such as a clamshell scoop, a jackhammer, a robotic hand or the like.

In the embodiment shown, the backhoe 1 has three pivot joints 14, 15 and 16 which each originally came with a conventional pivot pin 26 which are each carefully removed so as to not disturb the structure of the joint or paint about the pin 26 and replaced by the sensor 5.

The sensor 5 includes a bearing 30 and a replacement pin 31.

Figure 2:
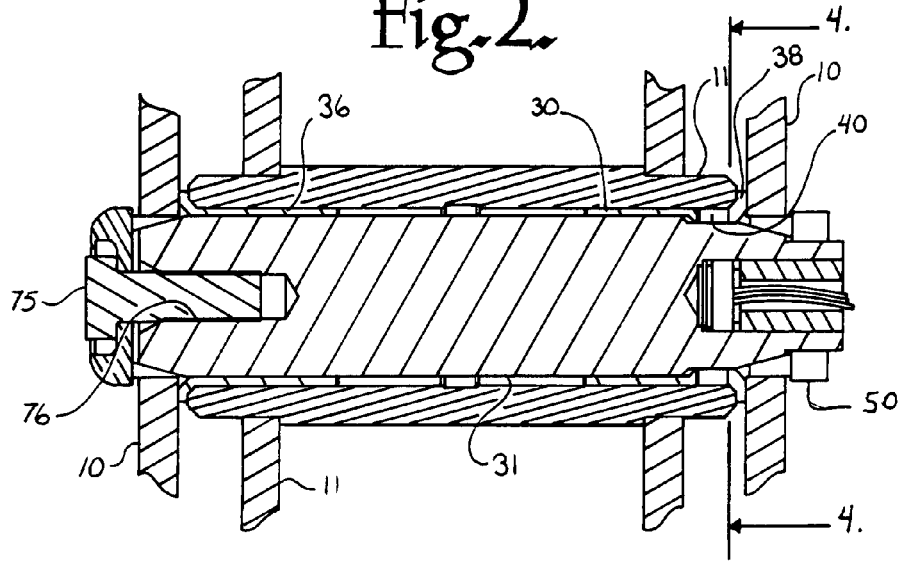
FIG. 2 is an enlarged cross sectional view of the backhoe and sensor, taken along line 2-2 of FIG. 1.
Figure 3:
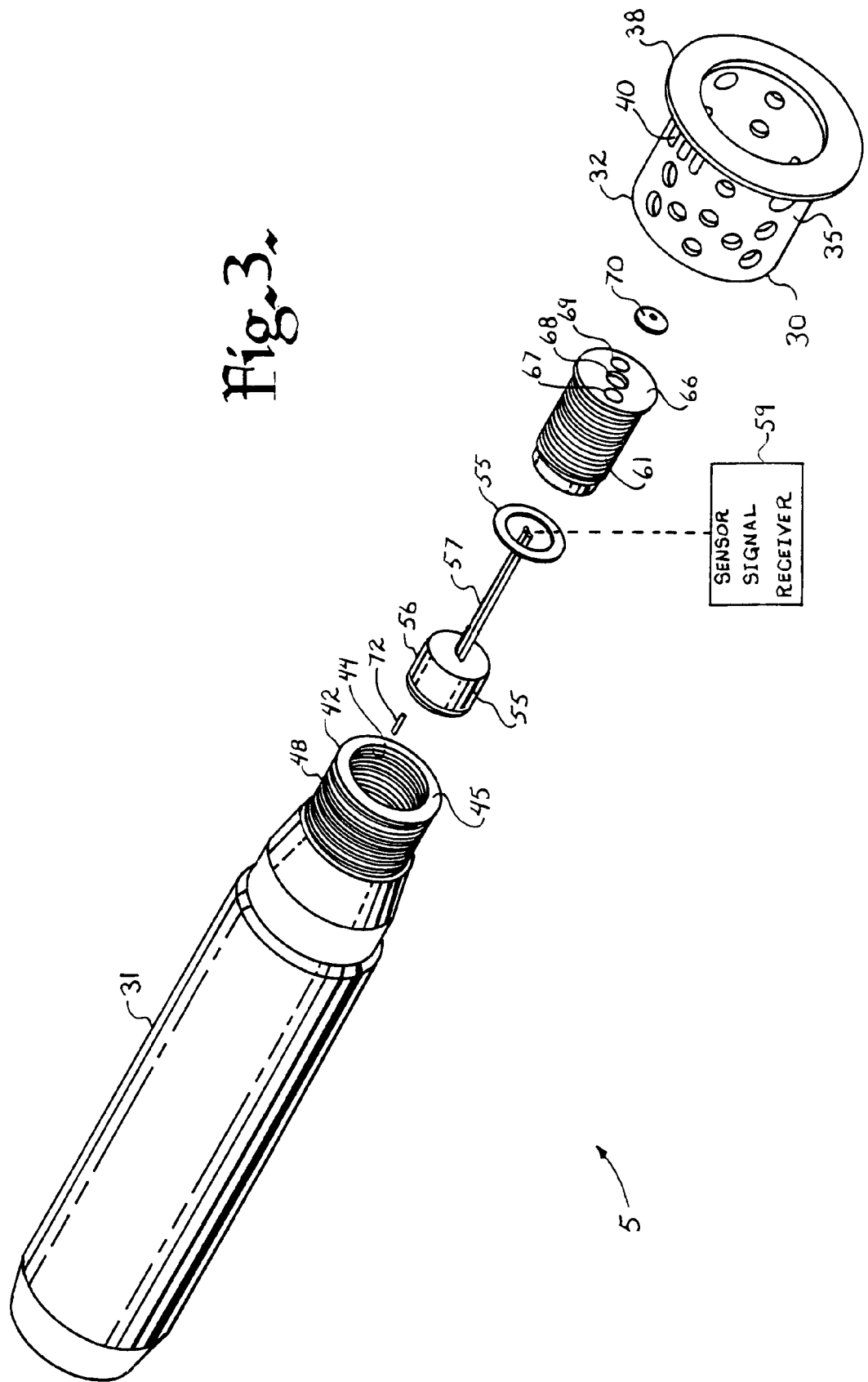
FIG. 3 is an exploded and perspective view of the sensor.

As seen in FIG. 2, the bearing 30 includes a perforated annular sleeve 35 that is sized and shaped to fit between an arm, such as arm 11 and an associated pin 31 while allowing relative rotation between the pin 31 and the arm 11. A companion bearing 36 is located opposite the bearing 30. The bearing 30 is press fit into the arm 11 and positively rotates with the arm 11.

Mounted on the end of the bearing sleeve 35 is a location positioning flange or ring 38. The ring 38 positions the bearing 30 relative to the arm 11. Mounted in groups of three on each side of the bearing 30 and diagonally opposed between groups are magnets 40. The magnets are high gauss magnets. It is foreseen that magnets in any combination or type necessary to provide for the sensor 5 may be used, but high gauss rare earth magnets are preferred.

The pin 31 is an elongate generally cylindrical rod with a Hall effect element receiver 42 at one end thereof. The receiver 42 includes a partially threaded bore 44 that extends radially and axially inward from one end 45. The exterior of the pin 31 around the bore 44 is of a smaller diameter than a remainder of the pin 31.

A threaded surface 48 on the outside of the pin 31 receives a keeper nut 50 (see FIG. 2).

The pin 31 includes a hall effect element 55 that has a cylindrical shaped outer body 56 with an interior plate or sheets and an electrical lead 57. The body 56 mounts snugly in the receiver 44 and radially in line with the magnets 40, so that the magnets create a magnetic field that is perpendicular to the element 55 plate as the magnets and plate rotate relative to one another. The lead 57 carries a signal to a remote location to a sensor signal receiver 59.

A plug 61 is externally threaded to be treaded into the receiver 44 behind the Hall effect element 55. A non magnetic spring washer 63 is located between the plug 61 and the element 55. The plug 61 has a length so that, when fully seated in the receiver 44, the plug 61 snugly holds the element 55 in place. The plug 61 has a front face 66 with three apertures 67, 68 and 69.

A grommet 70 mounts in aperture 68 and both are penetrated by the element lead 57. The apertures 67 and 69 may be utilized to receive a tool to rotate the plug 61.

A placement pin 72 is received in the pin 31 and element 55 when joined to prevent relative rotation therebetween.

A bolt 75 is received in a threaded bore in the pin 31 opposite the bore 44. The bolt 75 secures the pin 31 to the arm 10 with the nut 50 and prevents relative rotation therebetween.

Figure 4:
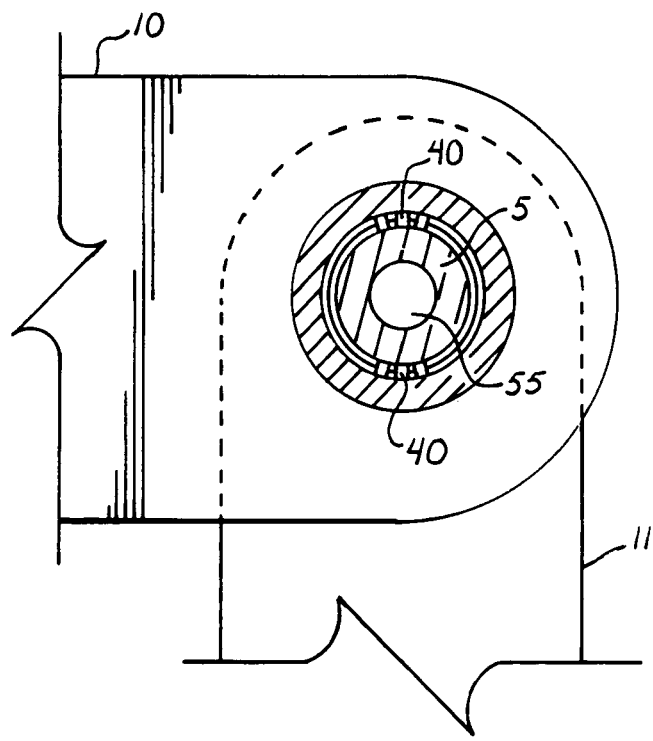
FIG. 4 is a fragmentary and partially schematic side elevational view of the backhoe and sensor with arms in a first configuration, taken along line 4-4 of FIG. 2.
Figure 5:
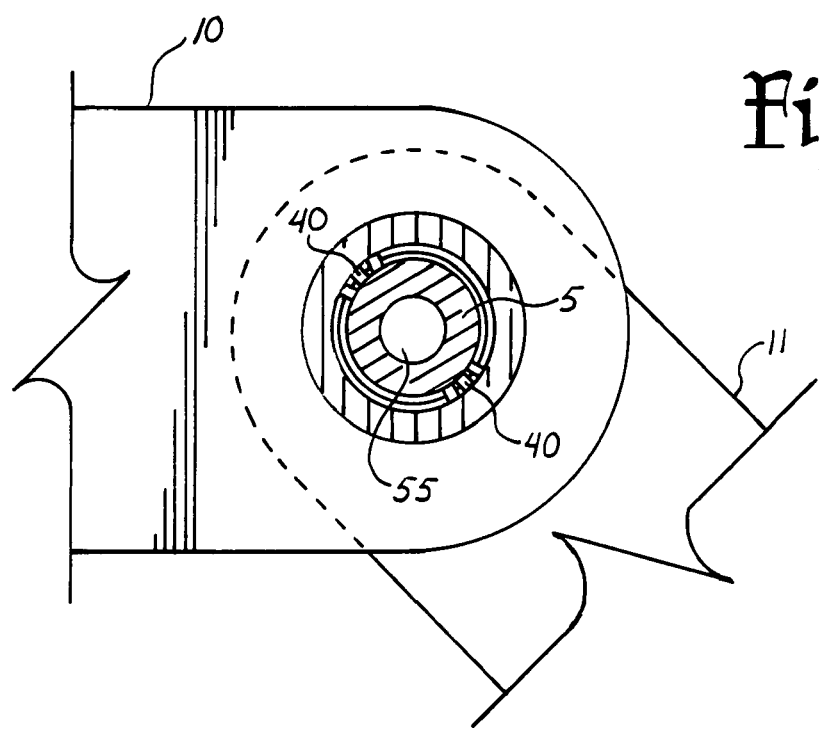
FIG. 5 is a view similar to FIG. 4 with the arms in a second configuration.

In use the original pins 26 are removed and the pins 31 are inserted and secured as shown in FIG. 2. The bearings 31 are also inserted and secured to respective arms. FIGS. 4 and 5 show relative rotation between arms such as arms 10 and 11. As shown, the magnets 40 rotate with the arm 11 as it rotates relative to the arm 10. The element 55 is stationary with respect to arm 10 and the magnets 40 rotate with respect to the element 55. The "Hall effect" in the element 55 changes output for each position of arm 10 relative to arm 11 such that an output signal is produced and carried by the lead 57 to a receiver 59. Each output different signal provides a specific angular position of arm 10 relative to arm 11 so as to allow a user or computer to receive the output at the receiver 59 and understand the relative position between the arms 10 and 11. This is done for each pair of arms or arm and tool pairing on the backhoe 1.

It is to be understood that while certain forms of the present invention have been illustrated and described herein, it is not to be limited to the specific forms or arrangement of parts described and shown.

What is claimed and desired to be secured by Letters Patent is as follows:

1. An angular position sensor for sensing the angular position of first and second arms relative to each other comprising:
    a) a pin including a Hall effect element operably rotating with the first arm;
    b) a magnet radially positioned with respect to the element and operably rotating with the second arm; and wherein
    c) the magnet is secured to a bearing between the pin and the second arm.

2. The sensor according to claim 1 wherein:
a) said pin includes a bore axially extending from a first end and sized and shaped to receive said element.

3. The sensor according to claim 2 wherein:
a) said pin includes a plug threadedly mounted in said first end bore for snugly holding said element within said bore.

4. An angular position sensor for sensing the angular position of first and second arms relative to each other comprising:
a) a pin including a Hall effect element operably rotating with the first arm;
b) a magnet radially positioned with respect to the element and operably rotating with the second arm; and wherein
c) the sensor is a retrofit sensor.

5. The sensor according to claim 4 including:
a) a receiver for receiving output from said element.

6. An angular position sensor for sensing the angular position of first and second arms relative to each other comprising:
a) a pin including a Hall effect element operably rotating with the first arm;
b) said pin includes a bore axially extending from a first end and sized and shaped to receive the element;
c) the pin includes a plug threadedly mounted in the first end bore for snugly holding the element within the bore; and
d) a magnet radially positioned with respect to the element and operably rotating with the second arm.

7. An angular position sensor for sensing the angular position of first and second arms relative to each other comprising:
a) a pin including a Hall effect element operably rotating with the first arm;
b) a magnet radially positioned with respect to the element and operably rotating with the second arm; and wherein
c) the arms are part of a earth working device and including the device.

* * * * *